(12) United States Patent
Shah et al.

(10) Patent No.: US 7,529,148 B2
(45) Date of Patent: May 5, 2009

(54) PROGRAMMABLE READ-ONLY MEMORY

(75) Inventors: Sunay Shah, Oxford (GB); Olivier Karim Abed-meraim, Old Marston (GB); Patrick Zebedee, Headington (GB)

(73) Assignee: Sharp Kabushiki Kaisha, Osaka (JP)

( * ) Notice: Subject to any disclaimer, the term of this patent is extended or adjusted under 35 U.S.C. 154(b) by 51 days.

(21) Appl. No.: 11/733,319

(22) Filed: Apr. 10, 2007

(65) Prior Publication Data

US 2007/0242495 A1  Oct. 18, 2007

(30) Foreign Application Priority Data

Apr. 13, 2006  (GB) ................................ 0607482.7

(51) Int. Cl.
*G11C 7/00* (2006.01)
(52) U.S. Cl. ..................................... 365/225.7; 365/96
(58) Field of Classification Search .............. 365/225.7, 365/96, 100, 104; 327/525, 567; 361/56
See application file for complete search history.

(56) References Cited

U.S. PATENT DOCUMENTS

| | | | |
|---|---|---|---|
| 4,649,521 A | 3/1987 | Tsuchida et al. | |
| 5,536,968 A | 7/1996 | Crafts et al. | |
| 5,708,291 A | 1/1998 | Bohr et al. | |
| 5,774,011 A | 6/1998 | Au et al. | |
| 6,392,468 B1 * | 5/2002 | Wu | ............................. 327/525 |
| 6,549,063 B1 | 4/2003 | Lehmann et al. | |
| 6,856,540 B2 * | 2/2005 | Peng et al. | ................... 365/177 |
| 7,265,421 B2 * | 9/2007 | Madurawe | ................... 257/348 |

(Continued)

FOREIGN PATENT DOCUMENTS

GB  2105906  3/1983

(Continued)

OTHER PUBLICATIONS

L.R. Metzger; "A 16K CMOS PROM with Polysilicon Fusible Links;" IEEE Journal of Solid-State Circuits, vol. SC-18, No. 5; Oct. 1983.

*Primary Examiner*—Vu A Le
(74) *Attorney, Agent, or Firm*—Renner, Otto, Boisselle & Sklar, LLP

(57) ABSTRACT

A programmable read-only memory comprises a memory cell or a plurality of such cells arranged as an array. Each memory cell comprises a transistor, such as a MOS TFT. An electronic switch allows the control electrode, such as the gate, to be substantially electrically isolated during a programming mode so that the gate is electrically floating during this mode. During the programming mode, a programming voltage is supplied across the main conductive path of the transistor, such as across the source-drain channel. The programming voltage is sufficiently large to fuse the main conduction path when the control electrode of the transistor is floating but is insufficient to fuse the main conduction path when the control electrode is not floating and is connected to a suitable defined voltage. The transistor therefore performs functions of memory cell selection while simultaneously acting as the fusible element and the arrangement requires fewer transistors which are capable of operating at the programming current required for fusing. The memory may therefore occupy a reduced area.

20 Claims, 22 Drawing Sheets

U.S. PATENT DOCUMENTS

| | | |
|---|---|---|
| 2002/0179999 A1 | 12/2002 | Lee et al. |
| 2003/0112055 A1* | 6/2003 | Reber et al. .................. 327/525 |
| 2004/0156234 A1 | 8/2004 | Peng et al. |
| 2005/0007855 A1* | 1/2005 | Lee et al. .................. 365/225.7 |
| 2005/0122760 A1 | 6/2005 | Lee et al. |
| 2005/0174845 A1 | 8/2005 | Koyama et al. |

FOREIGN PATENT DOCUMENTS

| | | |
|---|---|---|
| KR | 90-006140 | 8/1990 |
| KR | 2002-0081079 | 10/2002 |

* cited by examiner

PROGRAMMABLE READ-ONLY MEMORY

This Nonprovisional application claims priority under 35 U.S.C. § 119(a) on Patent Application No. 0607482.7 filed in U.K. on Apr. 13, 2006, the entire contents of which are hereby incorporated by reference.

FIELD OF THE INVENTION

The present invention relates to a programmable read-only memory. Such a memory may be used as a non-volatile memory for or in an integrated circuit, for example in applications which require storage of non-volatile "write-once" data. Examples of such applications include system identity data and post-production calibration data.

BACKGROUND OF THE INVENTION

Write-once or "one-time" programmable memory cells have been used in programmable read-only memory (PROM) arrays for many years. Two types of memory cells are in use and are known as "fuse" and "anti-fuse" types.

FIG. 1 of the accompanying drawings illustrates a known type of memory cell forming part of an array addressed by column electrodes such as 1 and row electrodes such as 2. Each cell comprises a fusible conductive link 3 connected in series with the source-drain channel of a transistor 4, such as N-MOS transistor. The link 3 is connected between the drain of the transistor 4 and the row electrode 2 of the row to which the cell belongs. The gate of the transistor 4 is connected to the column electrode 1 of the column to which the cell belongs. The source of the transistor 4 is connected to a common line, such as ground.

The link 3 is typically implemented in a doped poly-silicon layer. In order to program the cell, the transistor 4 is switched on and a high voltage is applied across the link 3, which causes a large current to flow through the cell. With a sufficiently high current, the link 3 is blown and becomes open circuit. Conversely, the link 3 remains intact if the transistor 4 is switched off during the application of the high programming voltage. During reading of the memory, when the cell is selected, a read-out circuit detects an open circuit if the link is blown or a closed circuit if the link is intact.

FIG. 2 of the accompanying drawings illustrates a typical architecture of an array or matrix of memory cells. The array 5 is addressed by column and row decoders 6 and 7 and is provided with read-out sense circuitry comprising or including a sense amplifier arrangement 8. A program control arrangement 9 is provided for controlling programming of the memory cells of the array 5 during a programming step.

Such a memory has several disadvantages. For example, in order to select a cell for programming, high voltages must be applied to the gate of the "selection" transistor 4. This requires the decoders to operate at supply voltages which are substantially greater than the nominal supply voltage required during memory reading operations after programming of the memory. Also, the selection transistors such as 4 must be able to pass a relatively large current during programming. This is typically achieved by making the transistors 4 sufficiently large to handle such large currents without damage. This in turn means that a relatively large area of an integrated circuit forming the memory is required and limits the number of memory cells which may be integrated in a given area of the memory device.

A memory cell of an anti-fuse type of memory is illustrated in FIG. 3 of the accompanying drawings. The memory cell comprises a selection transistor 4 whose gate is connected to a common row electrode 2 and whose drain is connected via a capacitive element 10 to a common column electrode 1.

In order to program such a memory cell, the selection transistor 4 is switched on and a high voltage is applied across the capacitive element 10. The high voltage causes breakdown of the capacitor dielectric, which is usually in the form of gate-oxide, and creates a permanent short circuit between the terminals of the capacitive element 10. Conversely, the element 10 remains intact and open-circuit if the selection transistor 4 is switched off during the application of the high programming voltage. During the read mode when the memory cell is selected, a read-out circuit detects an open circuit if the element 10 is intact or a closed circuit if the element 10 has been programmed.

Again, such a memory requires that the decoding logic operate at relatively high programming voltages in order to enable the selection transistors 4 to be switched on or off. Further, relatively thin oxides are required in the element 10 in order to minimise the programming voltages. However, such thin oxides are not always a standard process feature of the manufacturing process for making such memories. Additional processing steps may therefore be necessary and this increases the cost of manufacture of such a memory and may reduce the manufacturing yield.

Metzger L. R., "A 16 K CMOS PROM with Poly-silicon Fusible Links", IEEE Journal of Solid State Circuits, vol. SC-18, no 5, October 1983 discloses the use of a poly-silicon fusible link in a PROM array. The memory cells of the array comprise a poly-silicon fuse connected in series with a bipolar selection transistor.

U.S. Pat. No. 5,536,968 discloses a PROM as illustrated in FIG. 4 of the accompanying drawings. In this type of memory, each memory cell comprises a selection diode connected in series with a fusible poly-silicon link. Such an arrangement again requires address and data logic which is capable of supplying relatively high programming voltages as well as sinking relatively high fusing currents.

FIG. 5 of the accompanying drawings illustrates a PROM of the type disclosed in US 2005/0174845A1. The memory is formed in poly-silicon thin film transistor (TFT) technology. Both "fuse" and "anti-fuse" elements are disclosed. Again, the decoding circuitry has to be capable of withstanding the relatively high programming voltages and the thin film transistors must be sufficiently large to be able to pass the relatively high currents required to blow the fusible elements.

FIGS. 6A and 6B of the accompanying drawings illustrate a silicided poly-silicon fuse structure formed using CMOS technology, for example as disclosed in U.S. Pat. No. 5,708,291. The structure is formed on oxide side layer 11 formed on a substrate 12 and comprises a poly-silicon layer 13 and a silicide layer 14. Contacts 15 and 16 are formed on the silicide layer 14.

The conductance of the fusible element is dominated by the low impedance of the material of the layer 14, which is a relatively low impedance silicide alloy. FIG. 6A illustrates the intact element. FIG. 6B illustrates the programmed element, in which the silicide alloy has agglomerated as shown at 17 and 18, so as to result in a relatively large increase in the impedance of the element.

Layers of silicide alloy and poly-silicon are available in many CMOS processes. However, in a typical low temperature poly-silicon TFT process, the provision of such a structure would require additional process steps.

US 2004/0156234A1 discloses a single transistor anti-fuse element formed in CMOS technology, for example as illustrated in FIG. 7 of the accompanying drawings. Each fuse element has a thicker dielectric 20 at a source end of the transistor channel as compared with the dielectric 21 at the drain end. This enables a highly doped, region to form at a predictable point in the channel when a high gate-drain voltage is applied. This in turn facilitates the formation of a short circuit between the gate and the newly formed doped region.

SUMMARY OF THE INVENTION

According to a first aspect of the invention, there is provided a programmable read-only memory comprising: at least one memory cell, the or each of which comprises a transistor having a main conduction path and a control electrode; at least one first electronic switch for selectively substantially isolating the control electrode of the at least one cell during a programming step; and an arrangement for applying, across the main conduction path of the at least one cell during the programming step, a voltage which is sufficient to fuse the main conduction path when the control electrode is substantially isolated and which is insufficient to fuse the main conduction path when the control electrode is not substantially isolated.

The or each transistor may comprise a metal oxide silicon transistor.

The or each transistor may comprise a field effect transistor, whose gate comprises the control electrode and whose source-drain channel comprises the main conduction path.

The or each transistor may comprise a thin film transistor.

The at least one cell may comprise an array of cells. The at least one first electronic switch may comprise a plurality of first electronic switches, each of which is associated with a respective one of the cells. As an alternative, the cells may be arranged as at least one set, the or each of which is associated with the or a respective one of the at least one first electronic switch.

The cells may be arranged as a plurality of groups, each of which has a respective read-out circuit. The main conduction paths of each group may be connected in parallel to the respective read-out circuit. The arrangement may be arranged to apply the voltage simultaneously to all of the main conduction paths of each group.

The cells may be connected to a common read-out circuit. The main conduction paths may be connected in parallel to the common read-out circuit. The arrangement may be arranged to apply the voltage simultaneously to all of the main conduction paths.

The or each read-out circuit may comprise a precharge transistor. The or each read-out circuit may comprise a bias transistor connected between the circuit input and the precharge circuit.

The or each read-out circuit may comprise a second electronic switch between the circuit input and output.

The or each read-out circuit may comprise a third electronic switch arranged to connect the circuit output to a common line during the programming step.

The or each first electronic switch may comprise a transistor.

The or each first electronic switch may comprise a transmission gate.

The or each first electronic switch may comprise a first switching device arranged to be controlled by a cell selection signal and a second switching device connected in parallel with the first switching device and arranged to be controlled by a cell programming signal during the programming step.

It is thus possible to provide a memory in which the or each memory cell comprises a transistor which also forms a fusible element. The area occupied by such a cell may therefore be substantially smaller than for cells of known types. Row and column logic circuits may operate at nominal supply voltages during the programming step and it is possible, in some embodiments, for a global programming voltage to be applied to all cells simultaneously. Relatively large devices for passing relatively large currents during programming may therefore be eliminated or substantially reduced in number so that the area occupied by the memory may be substantially less than for known types of memories. No additional processing steps are necessary during manufacture of such a memory. It is therefore possible to provide a memory of reduced area and/or higher capacity with little or no penalty in cost of production or in manufacturing yield.

DESCRIPTION OF THE EMBODIMENTS

Figure 1:
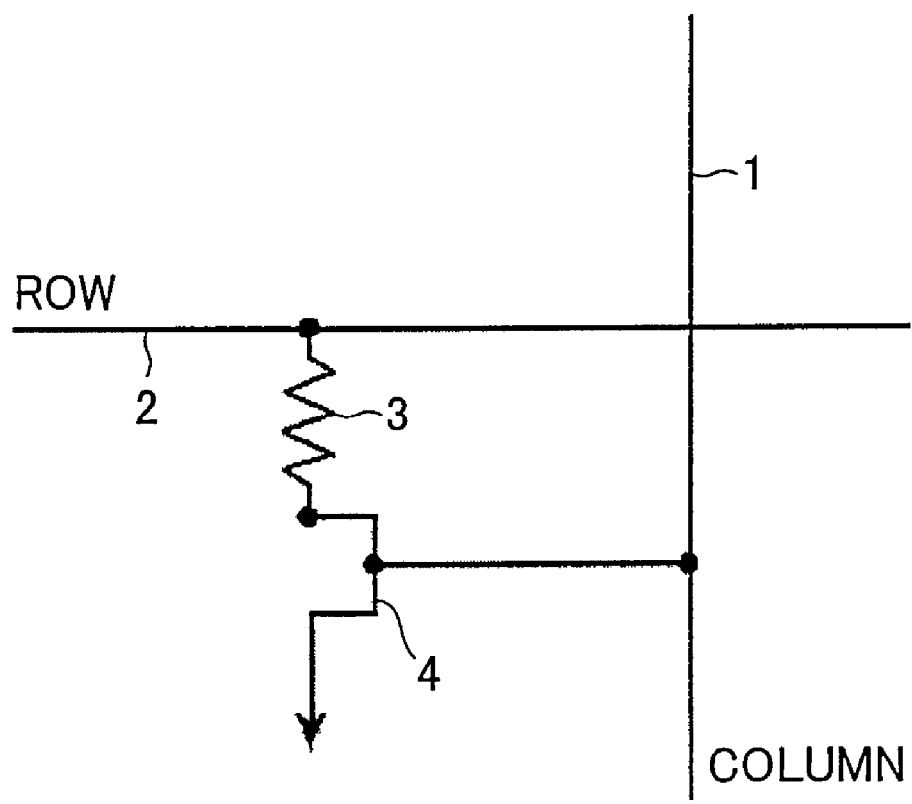
FIG. 1 is a circuit diagram of a fusible memory cell of known type for use in a memory array.
Figure 2:
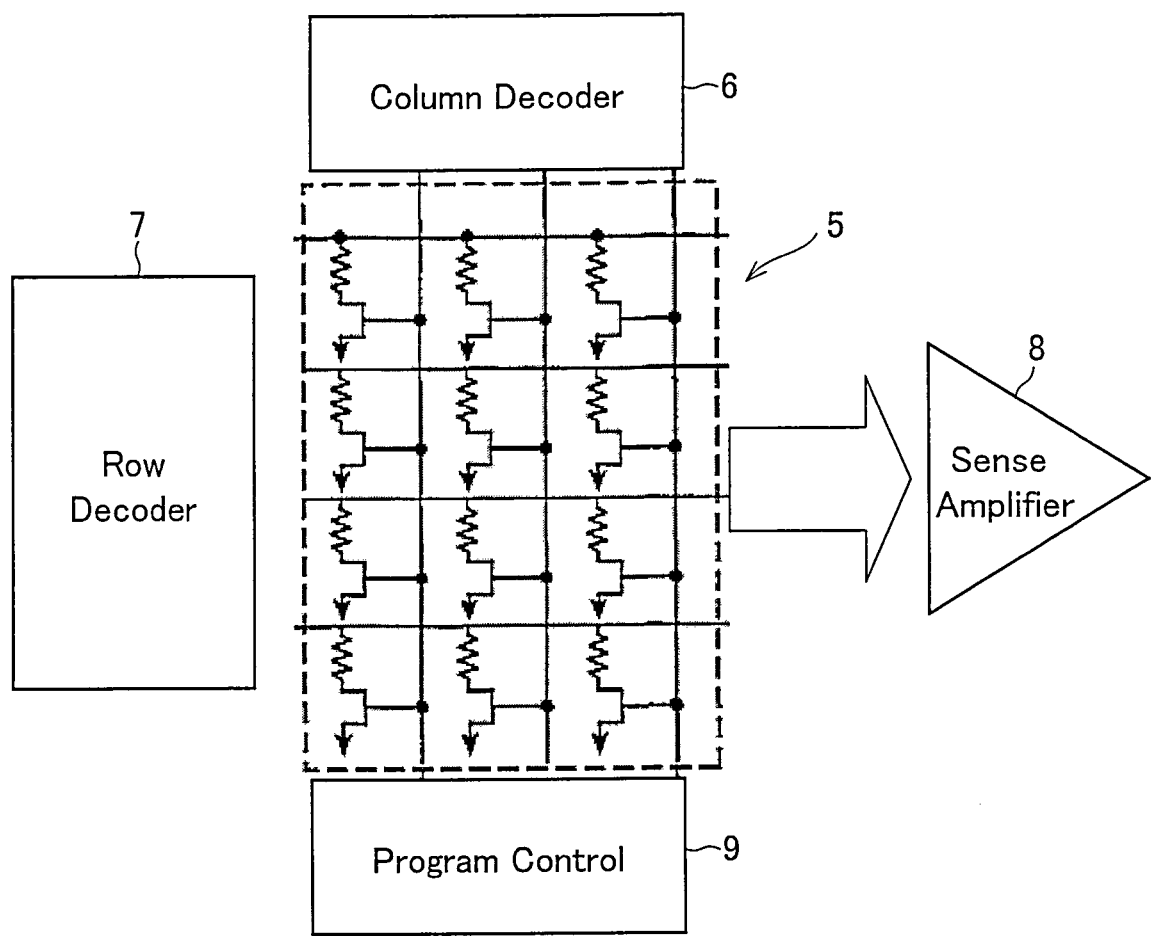
FIG. 2 is a block schematic diagram of a known type of memory including an array of cells of the type shown in FIG. 1.
Figure 3:
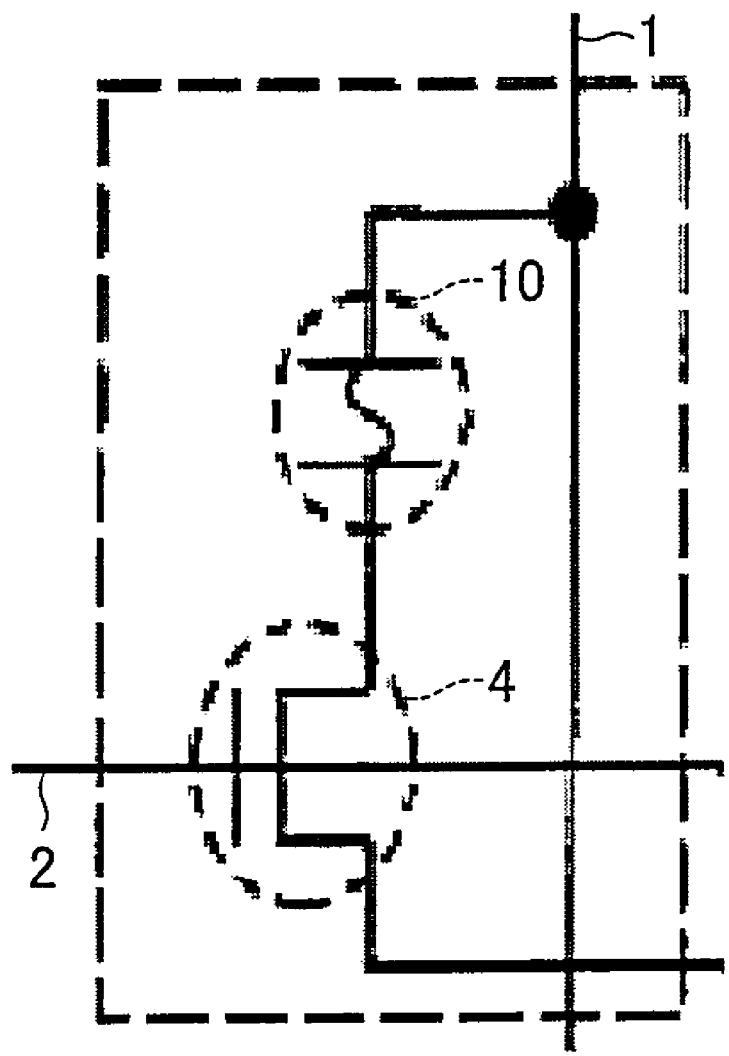
FIG. 3 is a circuit diagram of a known type of anti-fuse memory cell.
Figure 4:
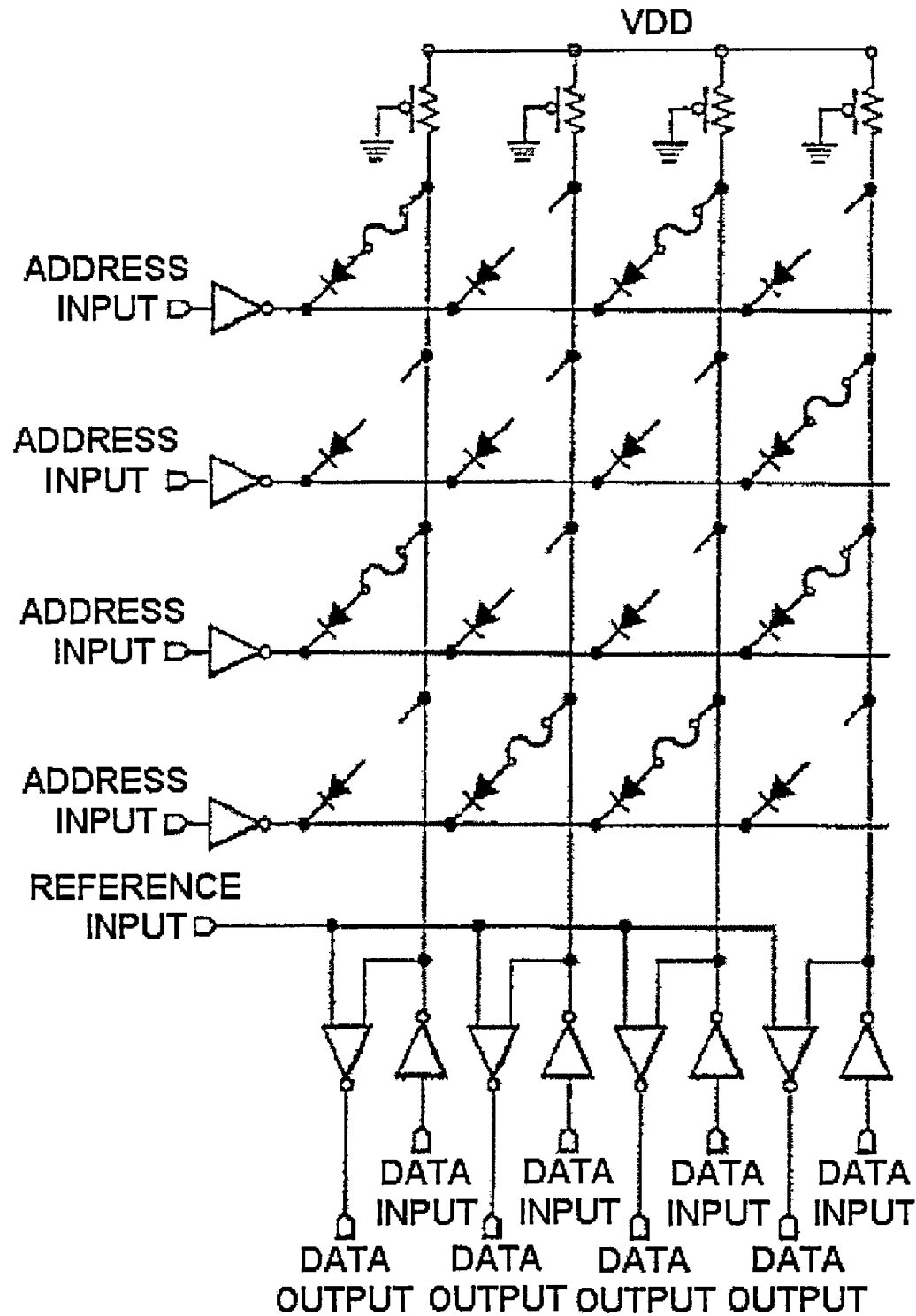
FIG. 4 is a circuit diagram of a known memory using an array of fusible links and diodes.
Figure 5:
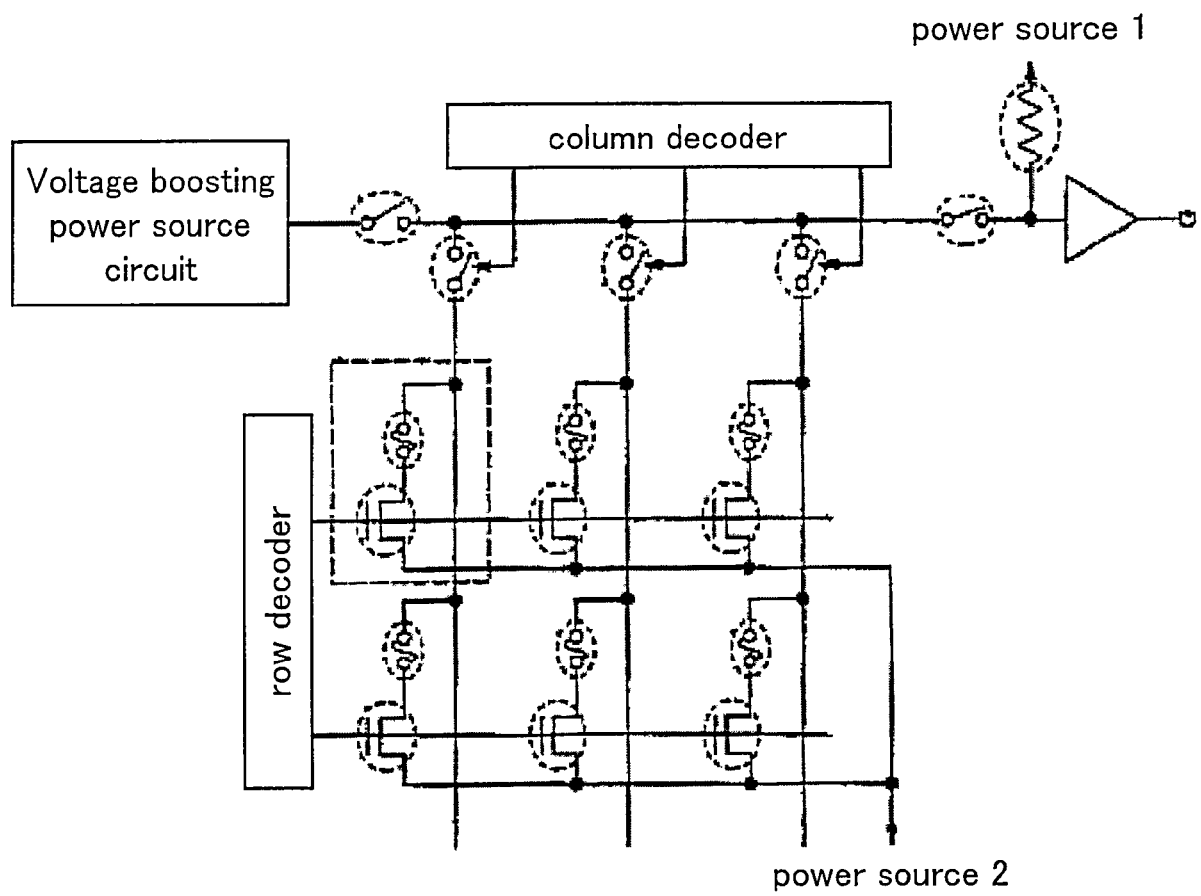
FIG. 5 is a schematic diagram of a known type of memory incorporating fusible links in a thin film transistor integrated circuit.
Figure 6A:
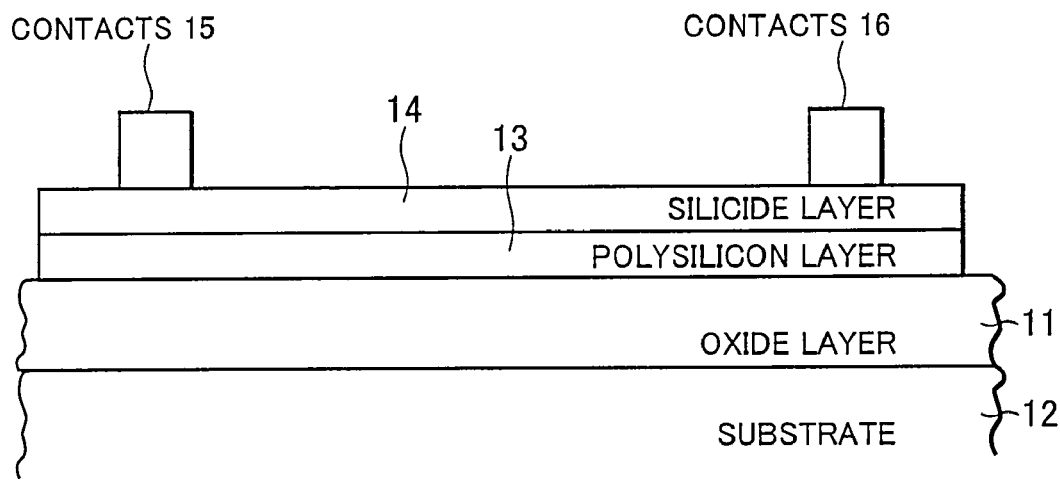
FIG. 6A is a diagram illustrating a known type of silicided poly-silicon fusing element before programming.
Figure 6B:
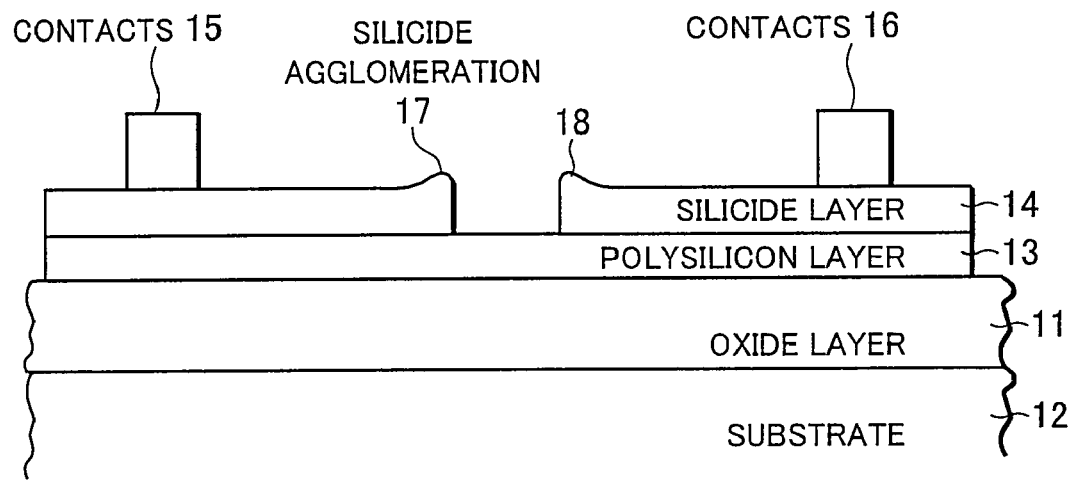
FIG. 6B is a diagram illustrating the silicided poly-silicon fusing element of FIG. 6A after programming.
Figure 7:
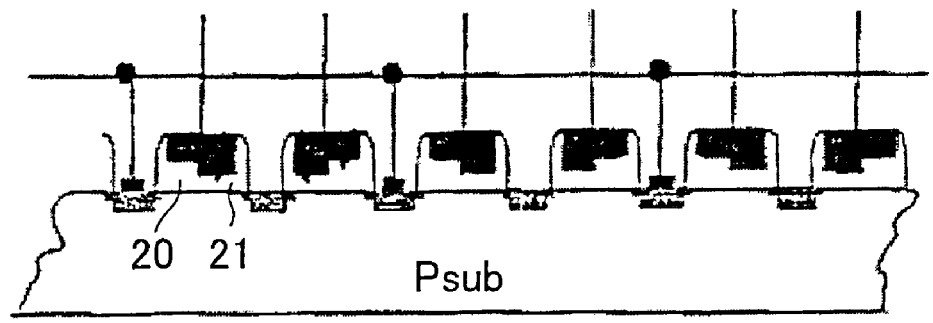
FIG. 7 is a cross-sectional diagram illustrating a known type of anti-fuse memory cell based on a dual thickness gate oxide arrangement.

Like reference numerals refer to like parts throughout the drawings.

Figure 8:
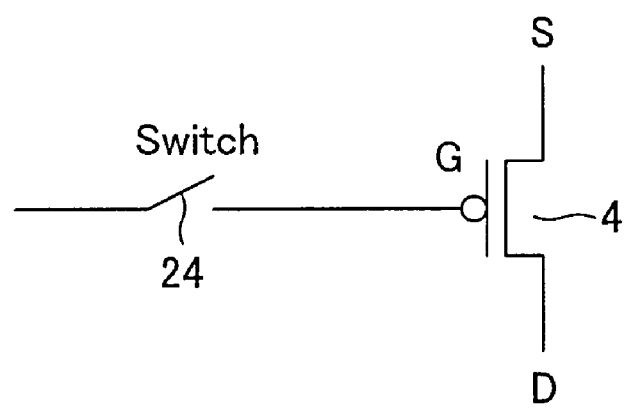
FIG. 8 is a diagram illustrating a memory cell which may be used as or in an embodiment of the invention.

The memory cell shown in FIG. 8 may be used as a single bit PROM for non-volatile storing of a single bit of information. More typically, the memory cell is used as one element of an array of memory cells which, together with row and column decoding circuits and read and programming circuits, forms a memory for storing multiple bits or multiple words of information. Such a memory may be formed as an integrated circuit for use with other devices or circuits or may form part of an integrated circuit incorporating circuitry for performing other functions.

The memory cell comprises a transistor 4 and an electronic switch (first electronic switch) 24. In the example shown in the FIG. 8, the transistor 4 is an insulated gate field effect transistor (IGFET), for example formed as a metal oxide silicon (MOS) transistor. For example, the transistor may be a thin film transistor (TFT) and has a control electrode in the form of a gate G and a main conduction path in the form of a channel between a source S and a drain D. The transistor is shown as a P-type MOS transistor but may equally well be of N-type.

The electronic switch 24 is selectively operable between a substantially closed-circuit or low impedance state and a substantially open-circuit of high impedance state. Following programming of the memory cell, the switch 24 is closed permanently or when reading of the memory cell is to be performed. During programming of the memory cell to store a bit of data in a non-volatile fashion, the switch 24 may be open or closed depending on the required state of the stored bit. When the switch 24 is closed, a defined bias voltage, for example equal to the source voltage, is applied to the gate G of the transistor 4 so that the transistor 4 remains "intact". When the switch 24 is open during programming, the gate G of the transistor 4 is substantially electrically isolated so as to be substantially electrically "floating". This allows the transistor 4 to be programmed so as to form a permanent open-circuit between the source and drain electrodes S and D, as described hereinafter.

Figure 9A:
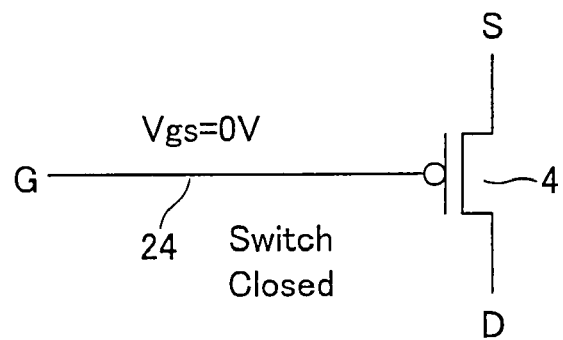
FIG. 9A is a diagram illustrating the memory cell of FIG. 8 with a switch of the memory cell closed.
Figure 9B:
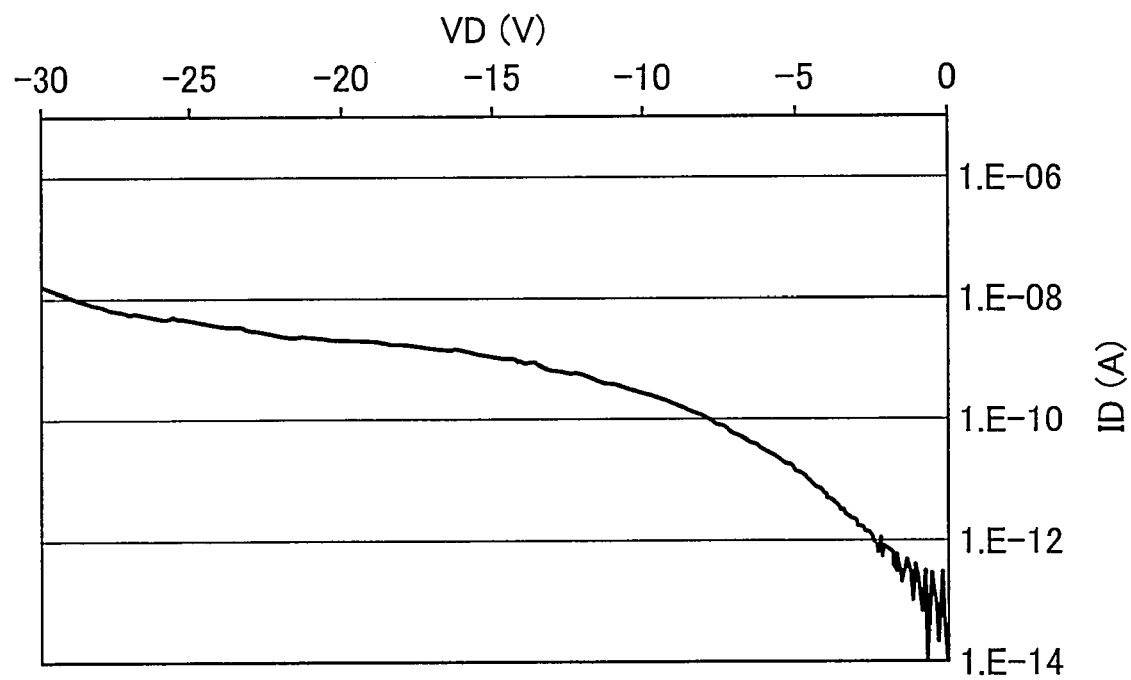
FIG. 9B is a graph illustrating a characteristic of the memory cell of FIG. 9A permitting programming of the memory cell.

FIG. 9B illustrates a characteristic of the transistor 4 of FIG. 9A in the form of a graph of channel current in amps (to a logarithmic scale) against the voltage applied across the source and drain of the transistor 4 with the voltage between the gate and source maintained at zero volts. As the source-drain voltage increases in magnitude from zero to −30 volts, the drain current increases substantially continuously and monotonically without the transistor 4 suffering damage. In this example, the nominal operating supply voltage of the transistor 4 is 8 volts.

Figure 10A:
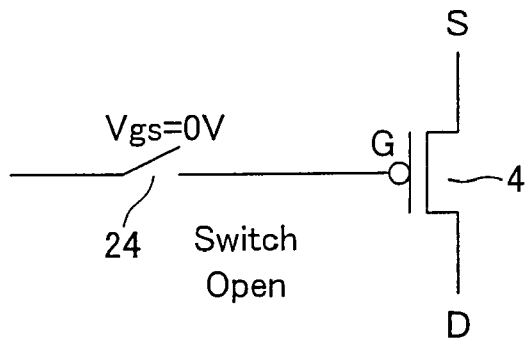
FIG. 10A is a diagram illustrating the memory cell of FIG. 8 with a switch of the memory cell open.
Figure 10B:
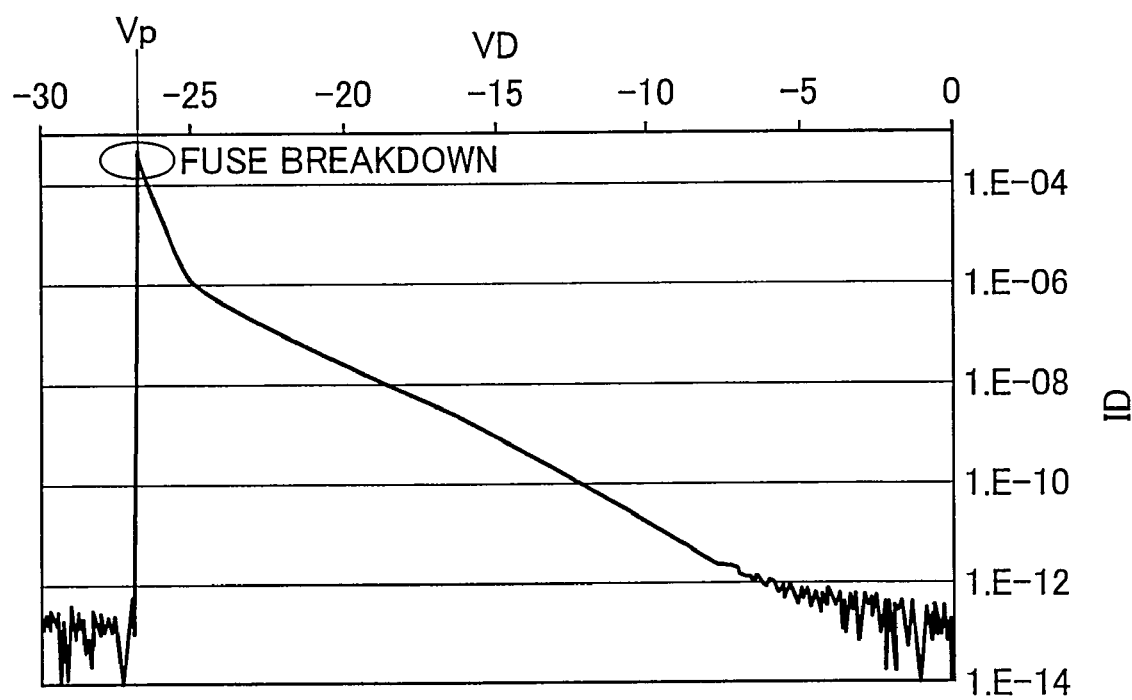
FIG. 10B is a graph illustrating a characteristic of the memory cell of FIG. 10A permitting programming of the memory cell.

FIG. 10B is a diagram similar to FIG. 9B but illustrating what happens when the switch 24 is open, as illustrated in FIG. 10A, so that the gate of the transistor 4 is floating and the source-drain voltage is increased from zero to −30 volts. In this mode, the drain or channel current increases more rapidly until it reaches approximately 0.5 mA at a source-drain voltage of −27 volts. At this point, the current suddenly decreases to approximately 0.1 pA and remains at this level for higher source-drain voltages. The sudden drop in current indicates the point in the characteristic at which the source-drain channel becomes permanently open-circuit or "blown", so that the transistor 4 itself acts as a blown fuse or fusible element. The breakdown or programming voltage Vp at which this occurs depends on the type of transistor, its geometry and the process technology used for its manufacture but, for the typical example illustrated in FIGS. 8 to 10, the programming voltage is −27 volts for a transistor whose nominal operating supply voltage is 8 volts.

In practice, during programming of the memory cell, a source-drain voltage of magnitude greater than or equal to the programming voltage Vp is applied across the source-drain channel of the transistor 4. The state of the switch 24 then determines whether the transistor 4 is "blown" or remains intact. Following programming, the transistor 4 is operated, at least during read cycles, at its nominal 8 volts supply and, when selected for reading, the transistor either conducts or remains open-circuit depending on the programming data. Data storage is therefore non-volatile and the memory cell may be used as or as part of a PROM.

The transistor 4 thus performs the dual role of a selection transistor and a fusible link so that a memory cell of relatively small area may be formed. Thus, a multiple bit memory of a given memory capacity may be made smaller or a given size of memory may be of larger capacity. Also, any row and/or column logic circuits associated with the memory cell may operate at nominal "read" supply voltages during programming. Depending on the structure of the memory, a global programming voltage may be applied to groups of the memory cells or to all of the memory cells simultaneously. Transistors of relatively large size for handling relatively large programming currents are unnecessary or may be of substantially reduced number compared with known memories, again leading to reduced area.

Figure 11:
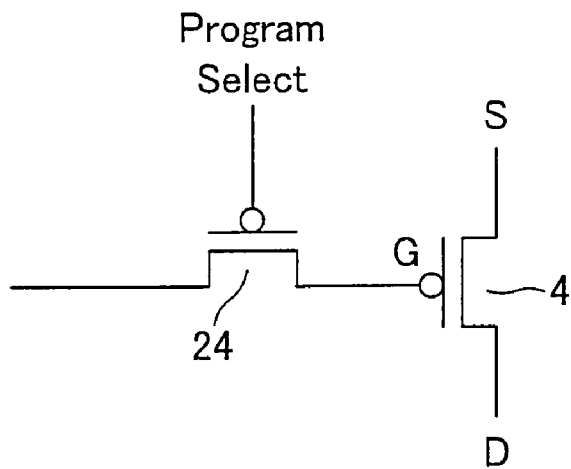
FIG. 11 is a diagram illustrating a first example of the memory cell shown in FIG. 8.

The memory cell shown in FIG. 11 is an example of the cell shown in FIG. 8 and again comprises a MOS transistor 4 of P-type, although other types of transistor and other conductivity types may equally well be used. In this example, the electronic switch 24 is also implemented as a MOS transistor of P-type although, again, other transistor types and conductivity types may be used. The gate of the transistor forming the switch 24 acts as the control input and is arranged to receive a program select signal for selecting the desired stored state of the memory cell during programming. In this example, the switch is opened by applying a relatively high level voltage as the program select signal and is closed by applying the complementary signal.

Figure 12:
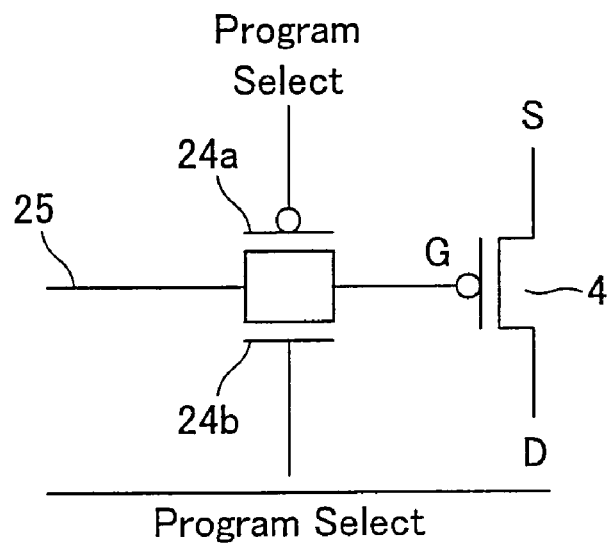
FIG. 12 is a diagram illustrating a second example of the memory cell shown in FIG. 8.

The memory cell shown in FIG. 12 differs from that shown in FIG. 11 in that the electronic switch is embodied by a transmission gate comprising MOS transistors 24a and 24b of P-type and N-type, respectively, with their source-drain channels connected in parallel. The transistors 24a and 24b have gates connected to receive complementary program select signals. Although such a memory cell requires an additional device and program signal line compared with that shown in FIG. 11, this arrangement ensures that, when the switch formed by the transistors 24a and 24b is closed, the gate G of the transistor 4 can always be set at the voltage at the terminal 25 of the memory cell.

Figure 13:
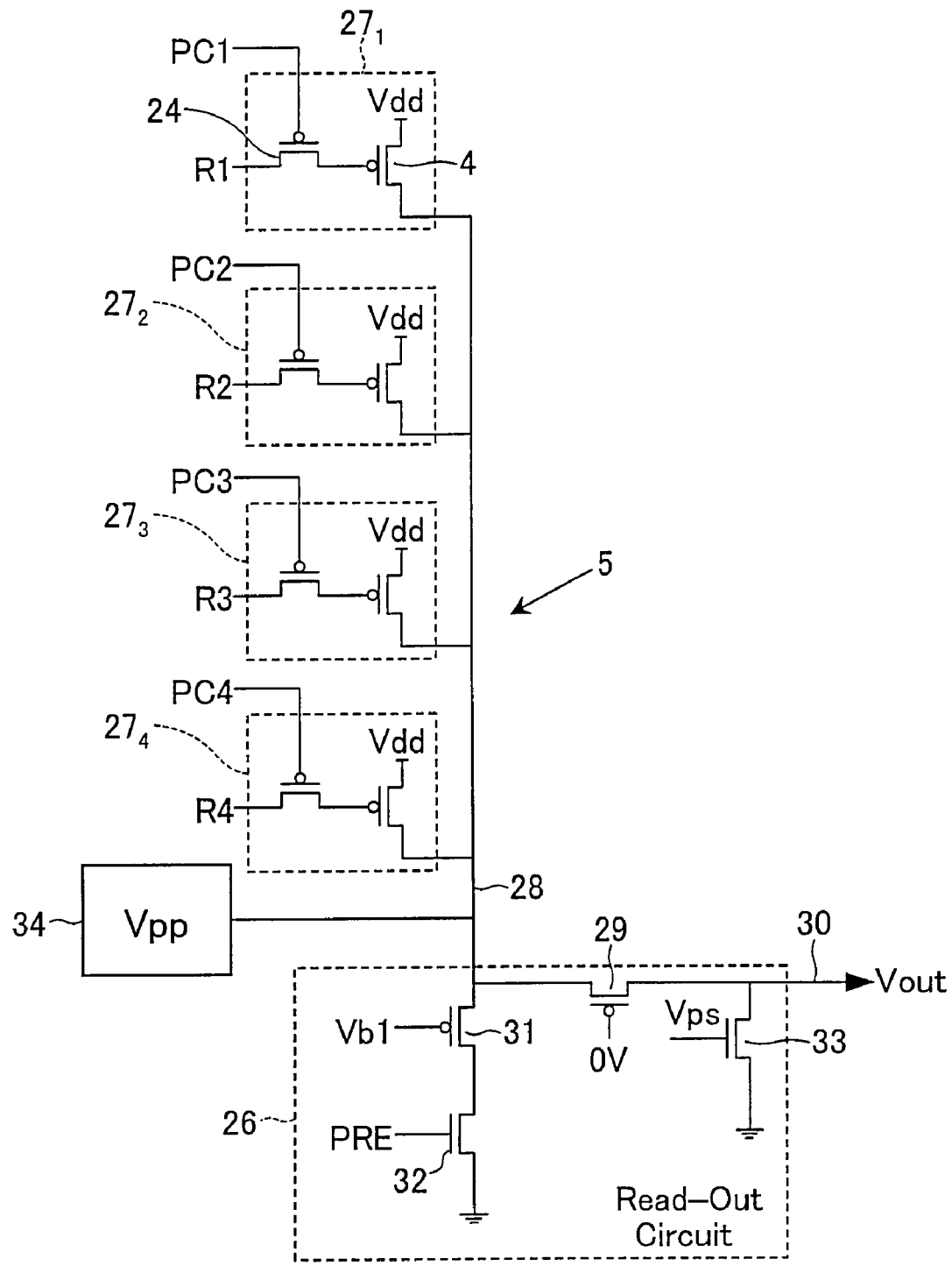
FIG. 13 is a circuit diagram illustrating part of a PROM comprising an array of memory elements of the type shown in FIG. 11.

FIG. 13 illustrates an array 5 of four memory cells $27_1$-$27_4$ arranged as a one-dimensional array connected to a common read-out circuit 26. The memory cells $27_1$-$27_4$ shown in FIG. 13 are of the type illustrated in FIG. 11 but may be of any suitable type, such as that illustrated in FIG. 12. The channels of the transistors such as 4 forming the fusible elements of the memory cells $27_1$-$27_4$ are connected in parallel between a supply line Vdd and a circuit node 28, which is connected to the input of the read-out circuit 26 and to an arrangement 34 for supplying the programming voltage Vpp during programming of the memory. The memory cells $27_1$-$27_4$ have "row" select inputs R1-R4, respectively, and program data lines PC1-PC4, respectively.

The input of the circuit 26 is connected via a P-type transistor (second electronic switch) 29 to the circuit output 30 for supplying output data Vout. The input is also connected via series-connected P-type and N-type transistors 31 and 32 to ground. The output 30 of the circuit 26 is connectable to ground via a transistor 31 of N-type. The gate of the transistor 29 is connected to always receive zero volts. The gates of the transistors 31 and 32 are connected to receive a column bias voltage Vb1, which is always zero volts, and a pre-charge signal PRE, respectively. The gate of the transistor (third electronic switch) 33 is connected to receive a programming protection signal Vps.

The memory may perform read operations using a dynamic mode or a static mode of operation. Each of the electronic switches such as 24 in the memory cells $27_1$-$27_4$ is closed by applying zero voltage to the corresponding program data line PC1-PC4 and is opened by applying a relatively high voltage, for example the voltage on the supply line Vdd.

In the dynamic reading mode, prior to each reading operation, the node 28 is pre-charged to a relatively low level voltage by applying a high logic level pulse as the signal PRE to the gate of the transistor (precharge transistor) 32. The bias voltage Vb1 is at zero volts so that the transistor (bias transistor) 31 is conductive. The protection signal Vps is at zero volts so that the transistor 33 is non-conductive. All of the switches such as 24 are closed by applying zero volts to the lines PC1-PC4.

The memory cells $27_1$-$27_4$ are read one at a time. After the pre-charge phase, a low logic level voltage is applied as the signal PRE to the gate of the transistor 32 so that it is non-conductive and therefore isolates node 28 from the supply line Vss. The bias voltage Vb1 is maintained at zero volts. The first cell $27_1$ is selected by applying a zero voltage to the row select line R1 whereas the other row select lines R2-R4 receive the voltage on the supply line Vdd. If the transistor 4 is intact, it is caused to conduct and pulls the voltage at the node 28, and hence at the output 30 of the circuit 26, substantially to the voltage on the supply line Vdd. Conversely, if the transistor 4 was blown during programming so as to be open-circuit, the node 28 and hence the output 30 remain at the low voltage. During such read operations, the node 28 is effectively isolated from the source of the programming voltage Vpp.

Figure 14:
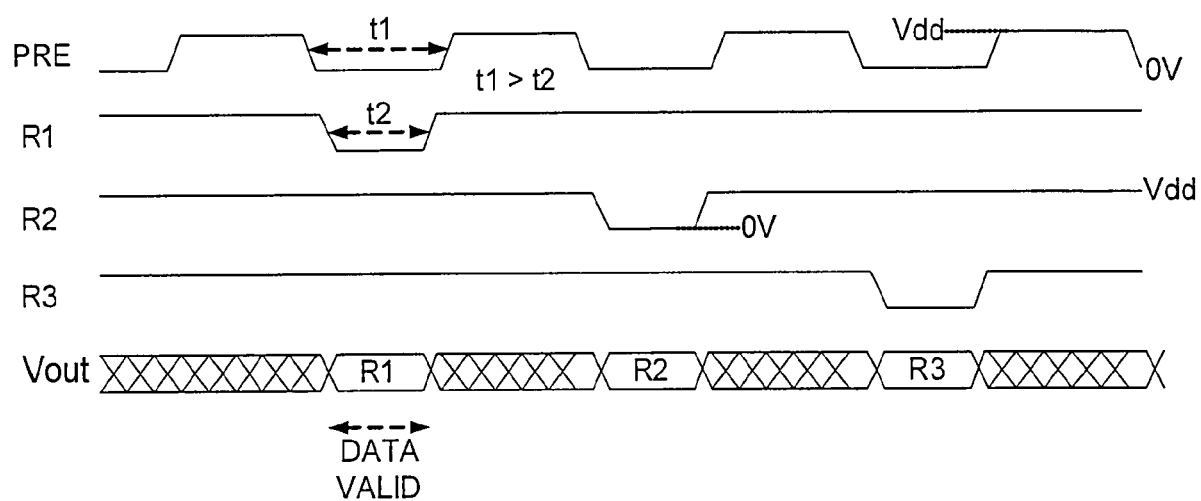
FIG. 14 is a timing diagram illustrating waveforms occurring during operation of the memory of FIG. 13.
Figure 15:
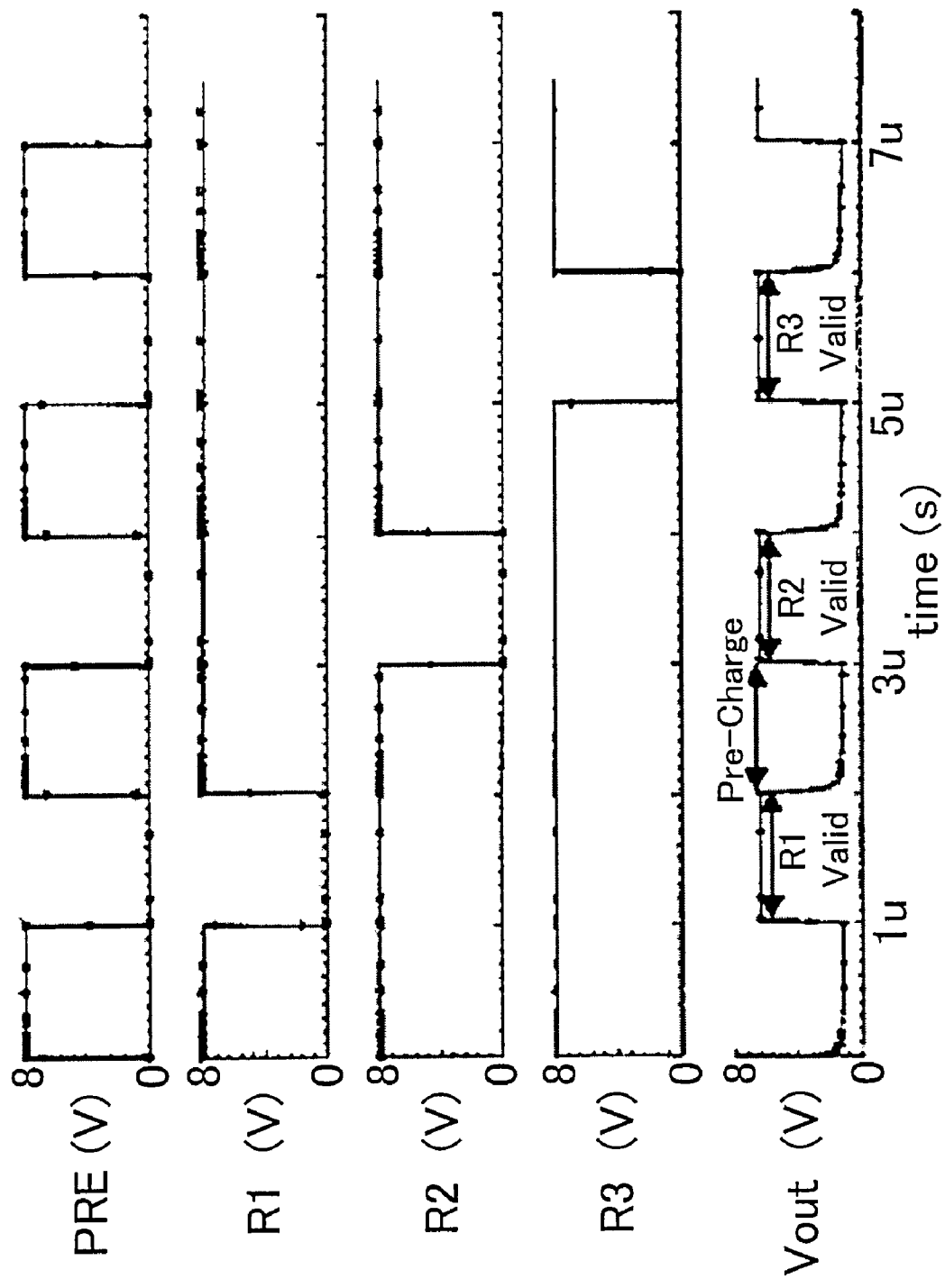
FIGS. 15, 16A and 16B illustrate the results of a simulation of the operation of the memory of FIG. 13.

The next "row" comprising the memory cell $27_2$ may then be read in the same way with node 28 first being pre-charged to zero volts followed by a zero voltage applied to the row select line R2 and the supply voltage applied to the row select lines R1, R3 and R4 of the non-selected memory cells. The data from the memory is thus read out in series from the memory cells $27_1$-$27_4$ with the output data only being valid when each cell is selected by a zero voltage on its row select line. FIG. 14 illustrates the timing of the waveforms which occur during such a dynamic mode of reading the memory and FIG. 15 illustrates the result of a simulation of such operation for the case where all of the transistors of the memory cells $27_1$-$27_4$ remain intact.

The cycle of pre-charge and read in the dynamic mode ensures that there is no direct conducting path from Vdd and Vss. Power is only consumed during the transitions of the PRE signal.

Figure 16A:
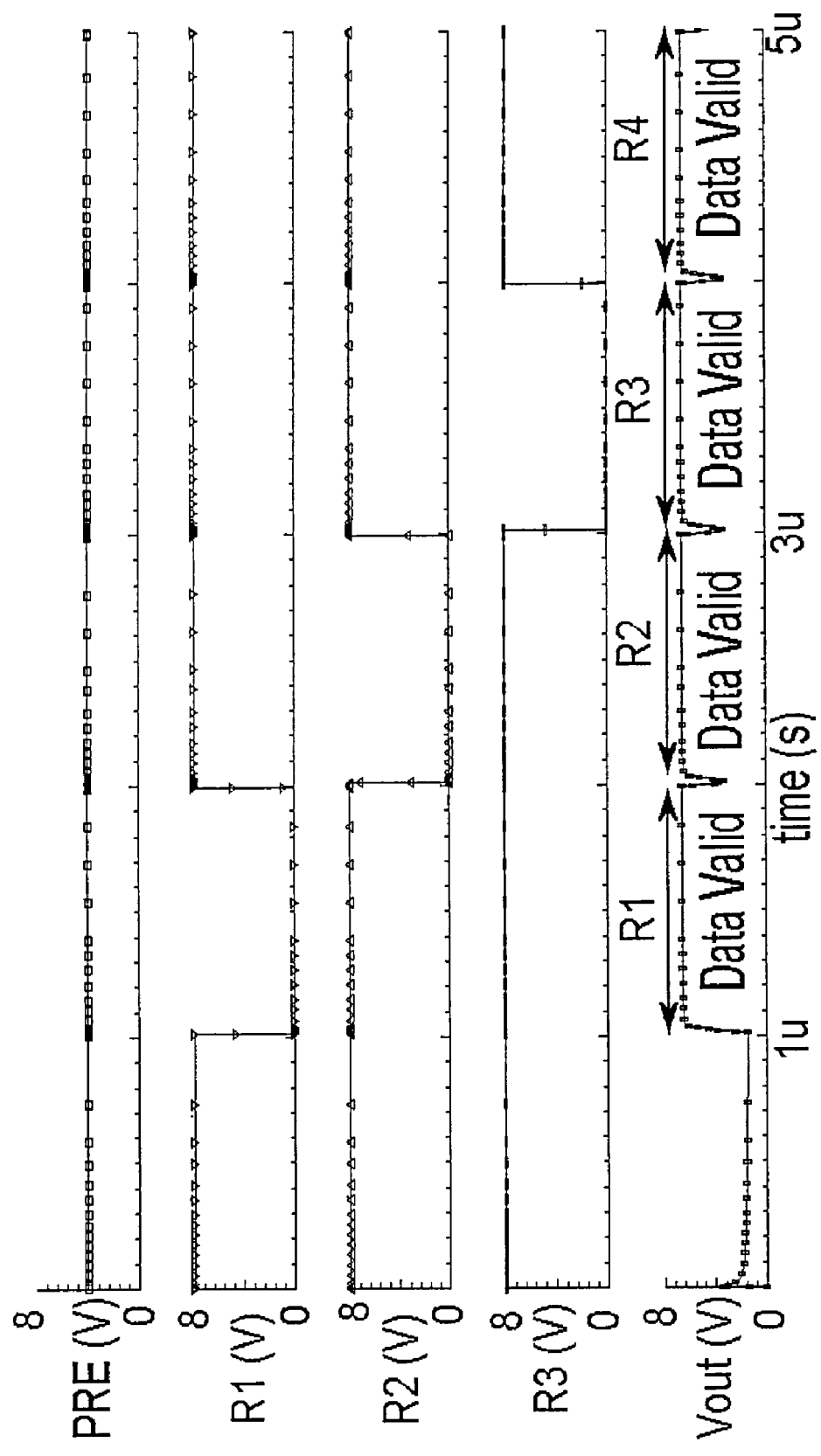
Figure 16B:
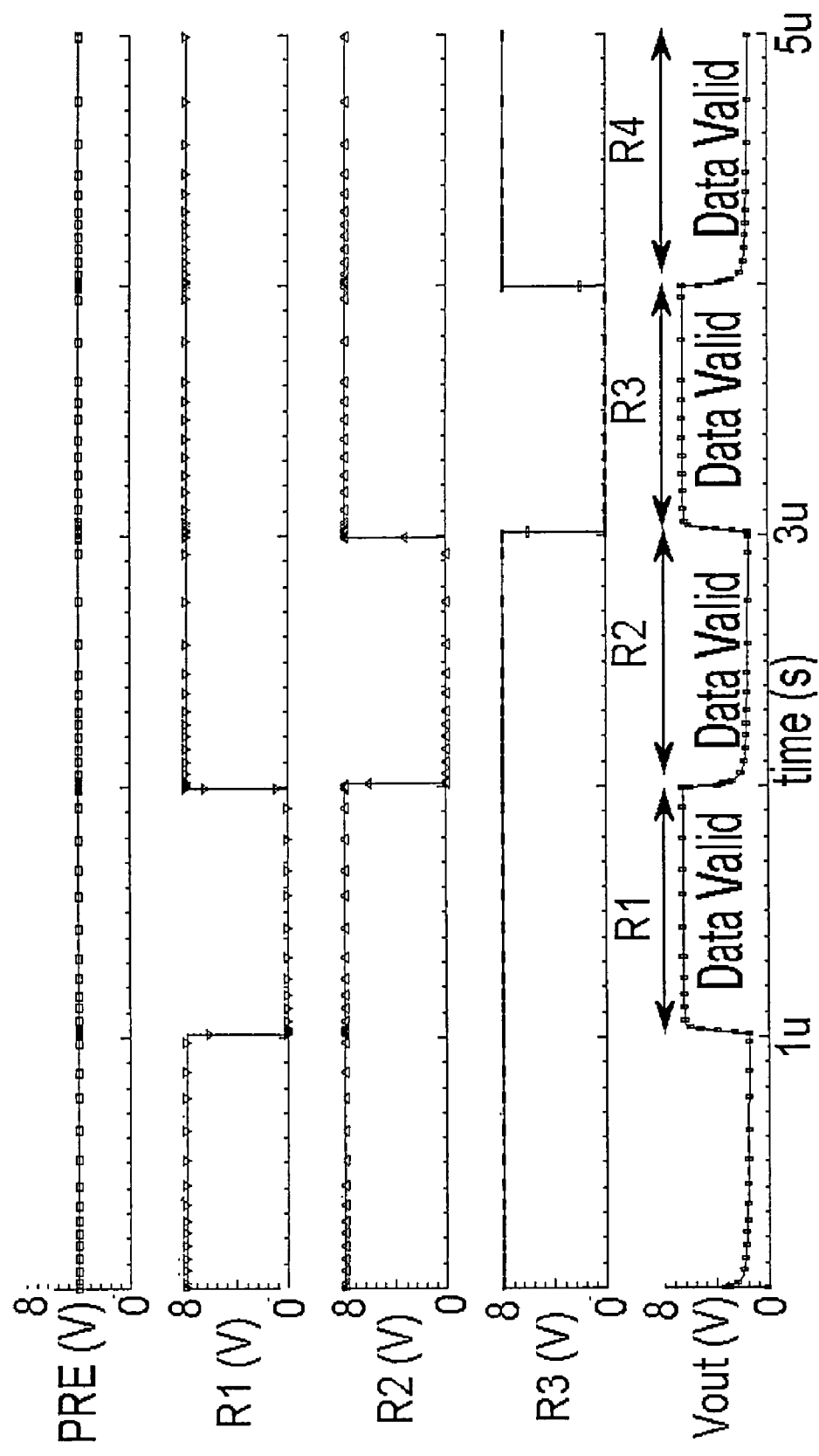

In the static mode of operation for reading the memory shown in FIG. 13, a constant bias voltage, which is typically a voltage midway between that on the supply line Vdd and ground potential, is constantly applied to the precharge line PRE and each memory cell is selected in turn as described above. If the transistor of the selected memory cell has been blown during programming so as to be open-circuit, the output Vout is pulled to a low voltage whereas, if the transistor is intact, the output voltage Vout is pulled to a high voltage level. Such operation is illustrated in FIGS. 16A and 16B, with the waveform diagram of FIG. 16A illustrating operation with all of the transistors intact and the waveform diagram of FIG. 16B illustrating operation with the transistors of alternately selected memory cells intact and the others open-circuit.

The static mode of operation results in the output 30 being valid at all times compared with the dynamic mode, which means that the speed of the read operation may be increased.

During a programming mode or step, a global programming voltage Vpp is supplied to the node 28 and the voltages supplied to the program data lines PC1-PC4 determine whether the associated transistor remains intact or become permanently open-circuit. For those cells where the transistor is required to remain intact, a zero voltage level is supplied to the corresponding program control line so that the associated switch 24 is closed and supplies a defined voltage, such as that on the supply line Vdd, to the gate of the transistor 4. For those transistors 4 which are required to be "blown" so as to permanently open-circuit, a high level signal such as that on the supply line Vdd is supplied to the gate of the corresponding transistor switch 24 so as to open the switch. The gate of the transistor is thus substantially electrically isolated or "floating".

The programming voltage Vpp should have a magnitude which is sufficient to blow the channels of the transistors whose gates are floating but insufficient to blow the channels of the transistors whose gates are connected to a defined voltage. For example, in the case of transistors having the characteristics illustrated in FIGS. 9 and 10, the voltage Vpp must have a magnitude which is at least equal to the sum of the breakdown voltage Vp and the supply voltage at the supply line Vdd. All of the memory cells $27_1$-$27_4$ may thus be programmed simultaneously.

During the programming step, the voltages at the gates of the transistors 31 and 32 are made substantially equal to zero volts so as to protect the transistor 32 from the relatively high programming voltage. The voltage at the gate of transistor 29 is at zero volts and the output 30 is pulled substantially to zero volts by applying the voltage on the supply line Vdd as the protection signal to the gate of the transistor 33 so as to ensure that transistor 29 is non-conductive and therefore any circuit connected to the output 30 is protected from the relatively high programming voltage.

The memory illustrated in FIG. 13 requires only a single global high voltage programming signal during programming of the memory. No large transistors or other devices are necessary for sourcing and/or sinking the relatively large programming currents associated with known types of memories. Further, all selection logic circuitry operates at the nominal supply voltage on the supply line Vdd during both programming and reading. It is not therefore necessary to provide, in such logic circuitry, active devices which are capable of withstanding the relatively high programming voltage and no special measures are necessary in order to protect lower voltage devices.

Figure 17:
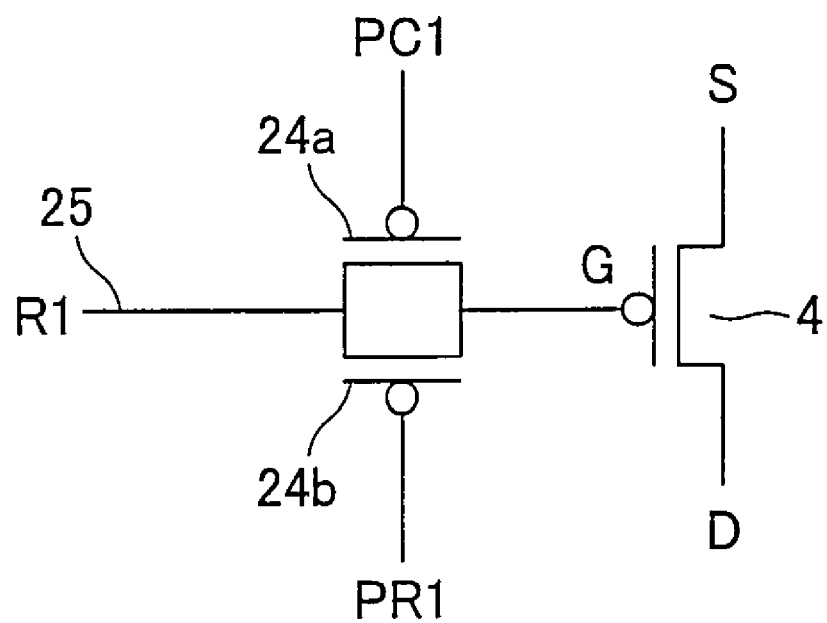
FIG. 17 is a diagram illustrating a further example of the memory cell of FIG. 8.

The memory cell illustrated in FIG. 17 differs from that shown in FIG. 12 in that the transistors 24a and 24b are of the same conductivity type (P-type in this case) and their gates are connected to receive independent control signals. The gate of the transistor (second switching device) 24a is connected to a program data line PC1 whereas the gate of the transistor (first switching device) 24b is connected to a program mode row select line PR1. The input 25 is connected to a row select line R1 which receives a constant defined voltage during programming and the programmed state of the transistor 4 is determined by the voltage levels on both of the lines PC1 and PR1. In order for the transistor 4 to be blown or made permanently open-circuit during the programming mode, a high voltage, such as that on the supply line Vdd, has to be present on both of the lines PC1 and PR1 so that both of the transistors 24a and 24b are open-circuit to allow the gate G of the transistor 4 to be isolated and floating.

Figure 18:
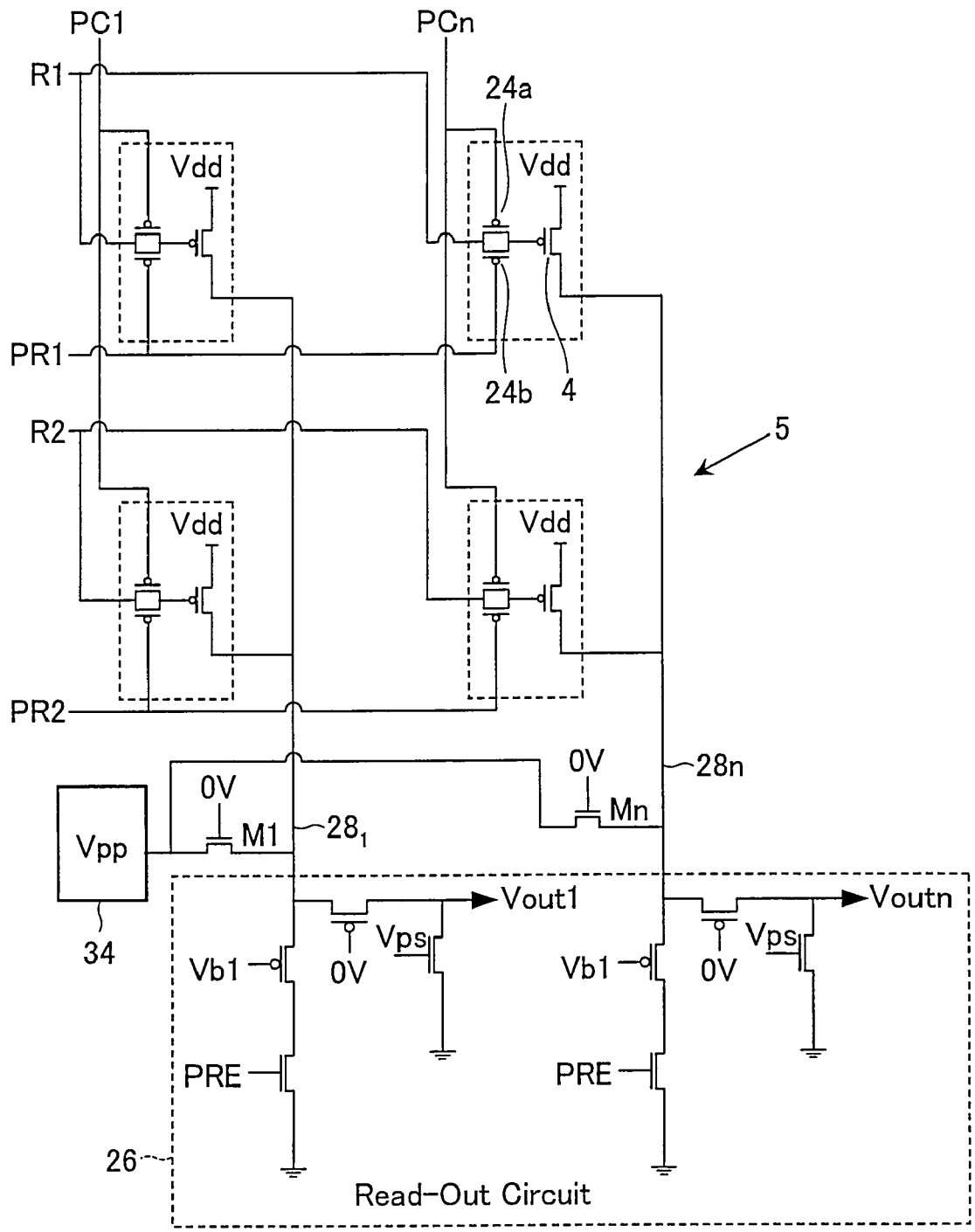
FIG. 18 is a circuit diagram of part of a PROM comprising an array of memory elements of the type shown in FIG. 17.

FIG. 18 illustrates a "two-dimensional" array of memory cells of the type illustrated in FIG. 17. An array comprising two rows and n columns is illustrated but any desired number of rows may be provided. The read-out circuit 26 comprises circuitry of the type shown in FIG. 13 for each of the columns of the array or matrix. The gates of the transistors 24a in each column of memory cells are connected to a common program data line PCi whereas the gates of the transistors 24b in each row are connected to a common row select line PRi.

During reading of the memory shown in FIG. 18, all of the row select lines PR1, PR2 and all of the program data lines PC1-PCn are connected to zero volts so that all of the transistors 24a, 24b are conductive and hence all of the switches of the memory cells are closed. The read mode row select lines R1, R2 are used to select each row at a time for reading, which may be performed in the dynamic mode or in the static mode as described hereinbefore. Each column of memory cells and the associated circuitry in the read-out circuit 26 operates as described hereinbefore for the memory shown in FIG. 13. Thus, n bits of data are read out simultaneously or "in parallel" from the currently selected row during the reading step.

Figure 19:
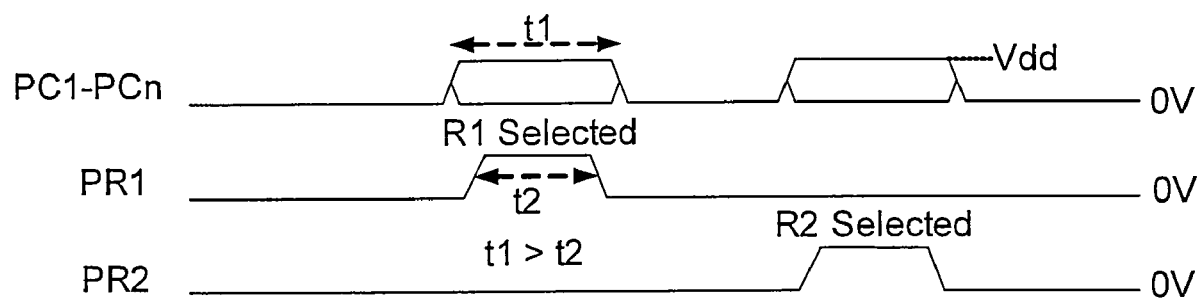
FIG. 19 is a timing diagram illustrating operation of the memory shown in FIG. 18.

During programming the row select lines R1, R2 are set to the voltage of the supply line Vdd and the lines PR1, PR2 and PC1-PCn are used to select the programmed states of the memory cells. The timing of such a programming mode is illustrated in the waveform diagram of FIG. 19.

The rows are selected in sequence for programming by changing the voltage of the corresponding row select line from zero volts to the voltage on the supply line Vdd. The voltage levels supplied to the program data lines PC1-PCn are selected according to the values of the data bits to be stored. If the transistor of the memory cell is required to be permanently open-circuit, a high voltage such as that on the supply line Vdd is supplied to the corresponding program data line whereas a low voltage on the program data line allows the memory cell transistor to remain intact. With the appropriate voltages supplied to the lines PR1, PR2 and PC1-PCn, the programming voltage Vpp is supplied via transistors M1-Mn to the circuit nodes $28_1$-$28_n$ so that the memory cells of the selected row are programmed simultaneously. In this case, the magnitude of the programming voltage Vpp must be equal to or greater than the sum of the supply voltage on the supply line Vdd and the breakdown voltage Vp minus the voltage drop across each of the transistors $28_1$-$28_n$.

During the programming operation, the transistors of the read-out circuit 26 are operated as described hereinbefore for the memory of FIG. 13. The transistors M1-Mn are shown as N-type transistors with their gates connected to receive zero volts. These transistors provide isolation such that the circuit nodes $28_1$-$28_n$ are effectively isolated from each other during reading operations of the memory. These transistors are required to be sufficiently large to sink the programming current of a single memory cell. However, only one such transistor is required per column of the memory array or matrix so that a substantial reduction in area may be obtained as compared with previously known memory arrangements.

Figure 20:
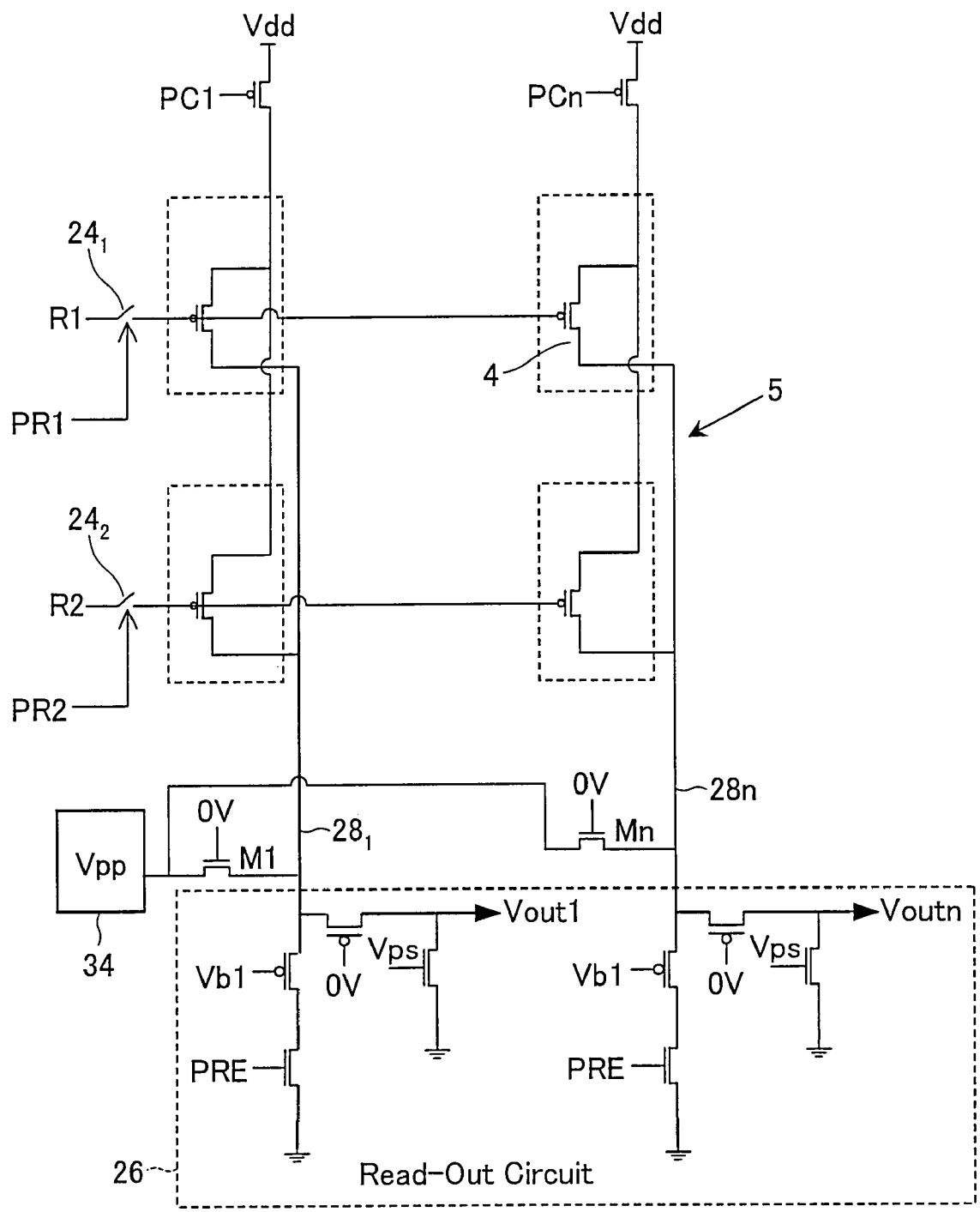
FIG. 20 is a circuit diagram of part of a PROM constituting another embodiment of the invention.

FIG. 20 shows a memory comprising an array of two rows and n columns of memory cells, although any desired number of rows may be provided. The columns of memory cells are connected to common nodes $28_1$-$28_n$, which are connected to a read-out circuit 26 of the same type as shown in FIG. 18. Also, isolating transistors M1-Mn connect the nodes $28_1$-$28_n$, respectively, to the arrangement for supplying the programming voltage Vpp.

The memory of FIG. 20 differs from that of FIG. 18 in that the transistors 24a and 24b are omitted so that each memory cell merely comprises a respective transistor 4. Column, row and data selection and control during programming are performed externally of the memory cells such that the gates of the transistors of each row of memory cells are connected to a common electronic switch $24_1$-$24_2$ and the drains of the transistors of each column are connected to a common (P-type) transistor $35_1$-$35_n$.

The memory of FIG. 20 may be read dynamically or statically as described hereinbefore and row by row in a similar manner to the reading operation of the memory shown in FIG. 18. In either case, the program data and column selection lines PC1-PCn and the program mode row select lines PR1 and PR2 are connected to receive a zero level voltage so that the transistor $35_1$-$35_n$ are switched on and the switches $24_1$-$24_2$ are closed. The read mode row select lines R1 and R2 are selected in sequence and the contents of the memory are read out a row at a time in parallel.

During programming of the memory, the row select lines R1 and R2 are connected to receive a defined voltage, such as that on the supply line Vdd. The rows are programmed in sequence with the switch $24_1$ or $24_2$ of the selected row being open and the switch of the or each unselected row being closed. The data to be stored are applied to the control lines PC1-PCn such that each of the transistors $35_1$-$35_n$ for a memory cell which is to be permanently open-circuit is switched on whereas the remainder of the transistors are switched off. The programming voltage Vpp is made equal to or greater than the sum of the voltage on the supply line Vdd and the transistor breakdown voltage Vp minus the voltage drop across each of the transistors M1-Mn. When the selected row has been programmed, the transistor $35_1$-$35_n$ are switched off and the programming procedure is performed for the next row to be programmed.

As in the case of the memory shown in FIG. 18, the transistors M1-Mn have to be sufficiently large to sink the programming current for each column, which programming current is equal to the programming current of a single memory cell because the memory is programmed a row at a time. Similarly, the transistors $35_1$-$35_n$ have to be sufficiently large to be able to source the programming current. However, each of the memory cells occupies less area because the electronic switching is removed from the memory cells and provided in common for each row. Thus, for a sufficiently large array or matrix of memory cells, the memory occupies a substantially smaller area.

The electronic switches $24_1$-$24_2$ may be embodied in any suitable way. For example, each of the switches may be embodied as a transistor as illustrated in FIG. 11 or as a transmission gate as illustrated in FIG. 12.

Figure 21:
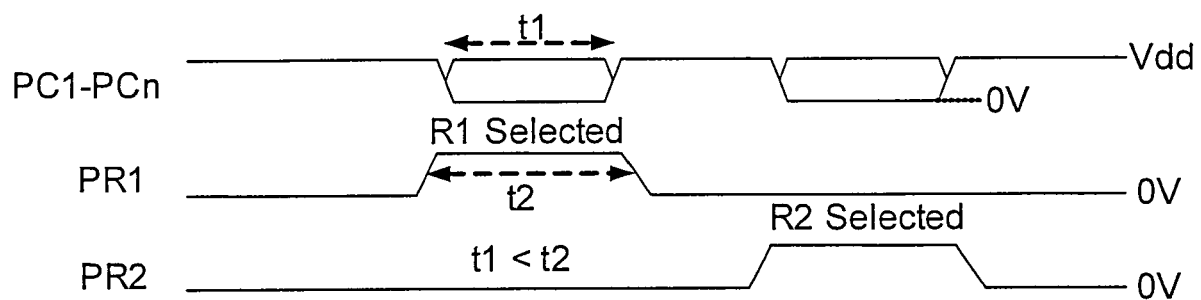
FIG. 21 is a timing diagram illustrating waveforms which occur during operation of the memory shown in FIG. 20.

FIG. 21 illustrates the timing of the waveforms on the lines PC1-PCn, PR1 and PR2 during the programming mode of operation.

Figure 22:
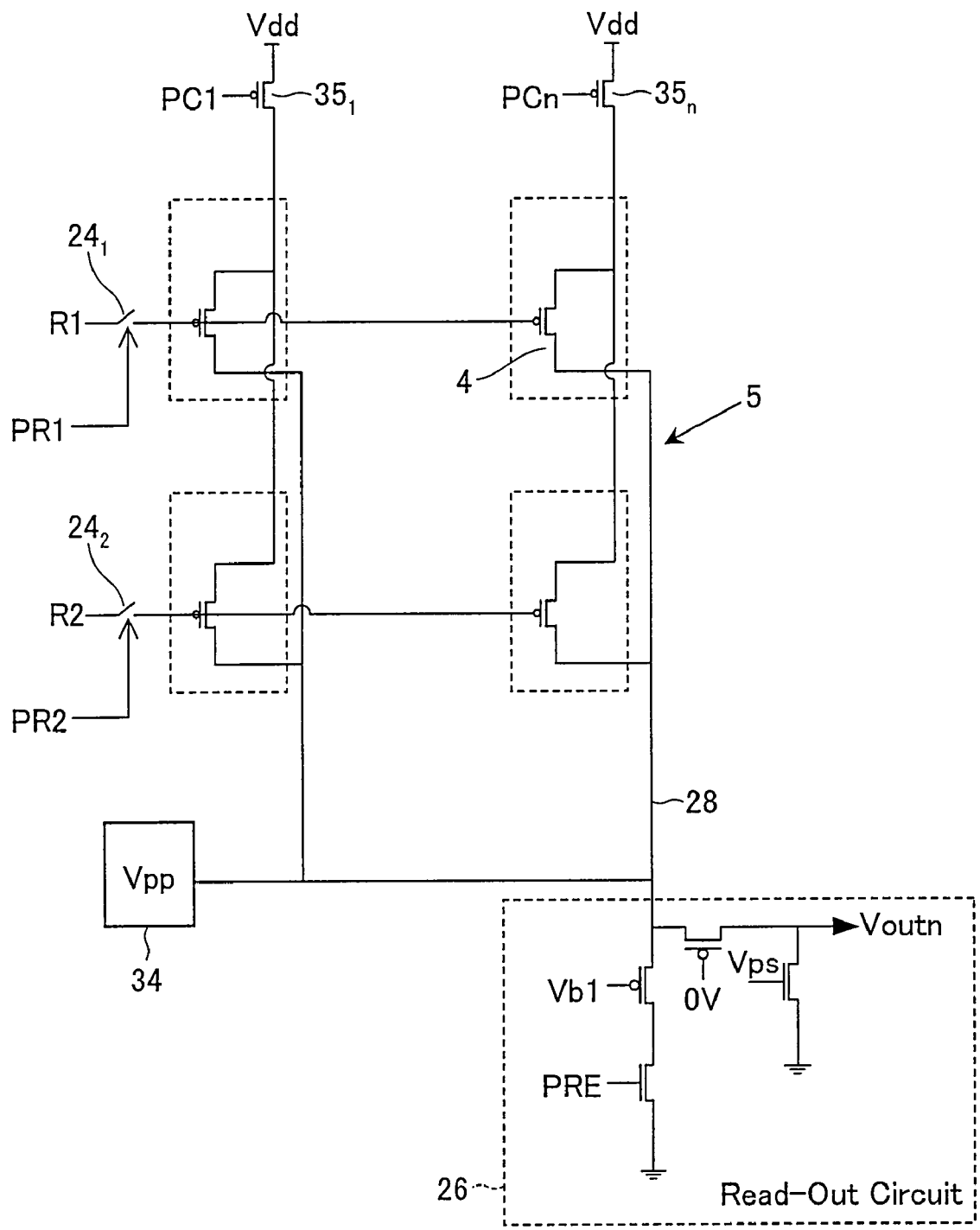
FIG. 22 is a circuit diagram of part of a PROM constituting a further embodiment of the invention.

The memory shown in FIG. 22 differs from that shown in FIG. 20 in that the columns of the memory cells are connected together at a single node 28 and to the input of a single circuit section of the read-out circuit 26 as illustrated in FIG. 13. The memory cells therefore have to be read one at a time to provide a serial data output. However, the relatively large isolation transistors M1-Mn are no longer required so that the area of the memory may be reduced as compared with the memory of FIG. 20.

Figure 23:
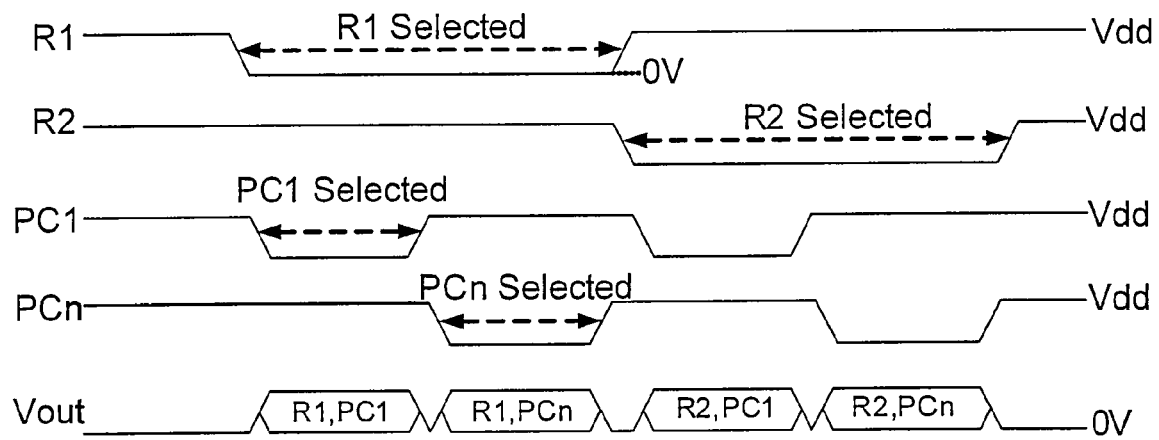
FIGS. 23 and 24 are timing diagrams illustrating waveforms which occur in the memory of FIG. 22 during alternative modes of operation.

Reading of the memory cells may be performed dynamically or statically as described hereinbefore. Also, reading may be performed in two different orders as illustrated by the waveform diagrams in FIGS. 23 and 24. In the mode illustrated in FIG. 23, the memory cells are read row by row. The switches $24_1$-$24_2$ are closed during all reading operations and the signals supplied to the lines R1 and R2 select the memory cells a row at a time. While each row is selected, the columns are selected one at a time by switching on the transistors $35_1$-$35_n$ one at a time and reading the state of the selected memory cell statically or dynamically.

Figure 24:
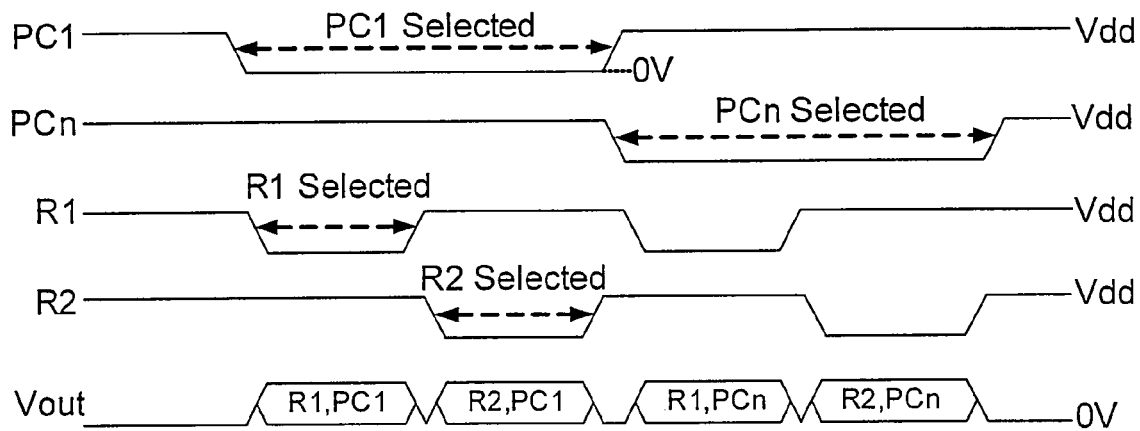

FIG. 24 illustrates an alternative mode, in which the columns are selected one at a time, and the memory cells of each column are read one at a time in sequence. In this case, the transistor $35_1$-$35_n$ of the selected column is switched on whereas the other transistors are switched off and the rows are selected one at a time while reading the state of the selected memory cell. This is repeated for each column in sequence in order to read the whole memory.

Programming of the memory shown in FIG. 22 may be performed in exactly the same way as described for the memory of FIG. 20. The memory is thus programmed a row at a time.

The invention being thus described, it will be obvious that the same may be varied in many ways. Such variations are not to be regarded as a departure from the spirit and scope of the invention, and all such modifications as would be obvious to one skilled in the art intended to be included within the scope of the following claims.

What is claimed is:

1. A programmable read-only memory comprising: at least one memory cell, the or each of which comprises a transistor having a main conduction path and a control electrode; at least one first electronic switch for selectively substantially isolating the control electrode of the at least one cell during a programming step; and an arrangement for applying, across the main conduction path of the at least one cell during the programming step, a voltage which is sufficient to fuse the main conduction path when the control electrode is substantially isolated and which is insufficient to fuse the main conduction path when the control electrode is not substantially isolated.

2. A memory as claimed in claim 1, in which the or each transistor comprises a metal oxide silicon transistor.

3. A memory as claimed in claim 1, in which the or each transistor comprises a field effect transistor, whose gate comprises the control electrode and whose source-drain channel comprises the main conduction path.

4. A memory as claimed in claim 1, in which the or each transistor comprises a thin film transistor.

5. A memory as claimed in claim 1, in which the at least one cell comprises an array of cells.

6. A memory as claimed in claim 5, in which the at least one first electronic switch comprises a plurality of first electronic switches, each of which is associated with a respective one of the cells.

7. A memory as claimed in claim 5, in which the cells are arranged as at least one set, the or each of which is associated with the or a respective one of the at least one first electronic switch.

8. A memory as claimed in claim 5, in which the cells are arranged as a plurality of groups, each of which has a respective read-out circuit.

9. A memory as claimed in claim 8, in which the main conduction paths of each group are connected in parallel to the respective read-out circuit.

10. A memory as claimed in claim 9, in which the arrangement is arranged to apply the voltage simultaneously to all of the main conduction paths of each group.

11. A memory as claimed in claim 5, in which the cells are connected to a common read-out circuit.

12. A memory as claimed in claim 11, in which the main conduction paths are connected in parallel to the common read-out circuit.

13. A memory as claimed in claim 12, in which the arrangement is arranged to apply the voltage simultaneously to all of the main conduction paths.

14. A memory as claimed in claim 8, in which the or each read-out circuit comprises a precharge transistor.

15. A memory as claimed in claim 14, in which the or each read-out circuit comprises a bias transistor connected between the circuit input and the precharge transistor.

16. A memory as claimed in claim 8, in which the or each read-out circuit comprise a second electronic switch between the circuit input and output.

17. A memory as claimed in claim 8, in which the or each read-out circuit comprises a third electronic switch arranged to connect the circuit output to a common line during the programming step.

18. A memory as claimed in claim 1, in which the or each first electronic switch comprises a transistor.

19. A memory as claimed in claim 1, in which the or each first electronic switch comprises a transmission gate.

20. A memory as claimed in claim 5, in which each first electronic switch comprises a first switching device arranged to be controlled by a cell selection signal and a second switching device connected in parallel with the first switching device and arranged to be controlled by a cell programming signal during the programming step.

* * * * *